(12) United States Patent
Kolman et al.

(10) Patent No.: US 7,031,867 B2
(45) Date of Patent: *Apr. 18, 2006

(54) METHODS AND APPARATUS FOR IDENTIFYING TEST NUMBER COLLISIONS

(75) Inventors: Robert S. Kolman, Longmont, CO (US); Reid Hayhow, La Porte, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 10/839,834

(22) Filed: May 5, 2004

(65) Prior Publication Data

US 2005/0251368 A1   Nov. 10, 2005

(51) Int. Cl.
*G06F 19/00* (2006.01)
*G06F 17/30* (2006.01)

(52) U.S. Cl. ............... 702/119; 707/201; 707/202; 707/203; 714/738

(58) Field of Classification Search ........ 707/201–203; 702/119; 714/738
See application file for complete search history.

(56) References Cited

U.S. PATENT DOCUMENTS 6,128,627 A * 10/2000 Mattis et al. ............... 707/202
6,578,031 B1 * 6/2003 Washizawa .................. 707/6
6,876,559 B1 * 4/2005 Rathnavelu et al. .......... 365/49

OTHER PUBLICATIONS

Robert S. Kolman, et al. "Method and Apparatus for Assigning Test Numbers", Filed May 5, 2004, U.S. Patent Application (18 pages of specification, 6 sheets of drawings (Figs. 1-9).
Robert S. Kolman, et al. "Method, Apparatus and Database Using a Map of Linked Data Nodes for Storing Test Numbers", Filed May 5, 2004, U.S. Patent Application (20 pages of specification, 5 sheets of drawings (Figs. 1-10).
Robert S. Kolman, et al. "Methods and Apparatus That Use Contextual Text Number Factors to Assign Test Numbers", Filed May 5, 2004, U.S. Patent Application (27 pages of specification, 8 sheets of drawings (Figs. 1-13).

(Continued)

*Primary Examiner*—Marc S. Hoff
*Assistant Examiner*—Janet Robbins

(57) ABSTRACT

In a method for assigning test numbers, current testflow context information is maintained during the execution of a testflow. Upon generation of a new test number for a result of a subtest in the testflow, a database of test numbers is indexed using the new test number. If the new test number appears as an entry in the database, a unique identifier associated with the entry is compared to index information comprising 1) an identifier of the subtest, and 2) the current testflow context information. If the unique identifier does not match the index information, a test number collision is identified. Otherwise, the new test number is assigned to the subtest. Other methods and apparatus for identifying test number collisions are also disclosed.

17 Claims, 7 Drawing Sheets

OTHER PUBLICATIONS

Robert S. Kolman, et al. "Methods and Apparatus That Use Contextual Test Number Factors to Assign Test Numbers", Filed May 5, 2004, U.S. Patent Application (25 pages of specification, 7 sheets of drawings (Figs. 1-10).

Robert S. Kolman, et al. "Methods and Apparatus for Handling Test Number Collisons", Filed May 5, 2004, U.S. Patent Application (28 pages of specification, 9 sheets of drawings (Figs. 1-12).

* cited by examiner

| Testflow Context | Base Number |
|---|---|
| "AAA" | 1 |
| "L1" | 10,000 |
| "BBB : L1" | 10,200 |
| "CCC : L1" | 10,220 |
| "L1 : L1" | 12,000 |
| "DDD : L1 : L1" | 12,000 |
| "L1 : L2" | 14,000 |
| "DDD : L1 : L2" | 14,000 |
| "L1 : L3" | 16,000 |
| "DDD : L1 : L3" | 16,000 |
| "L2" | 20,000 |
| "BBB : L2" | 20,200 |
| "CCC : L2" | 20,220 |
| "L2 : L1" | 22,000 |
| "DDD : L2 : L1" | 22,000 |
| "L2 : L2" | 24,000 |
| "DDD : L2 : L2" | 24,000 |
| "L2 : L3" | 26,000 |
| "DDD : L2 : L3" | 26,000 |
| "L3" | 30,000 |
| "BBB : L3" | 30,200 |
| "CCC : L3" | 30,220 |
| "L3 : L1" | 32,000 |
| "DDD : L3 : L1" | 32,000 |
| "L3 : L2" | 34,000 |
| "DDD : L3 : L2" | 34,000 |
| "L3 : L3" | 36,000 |
| "DDD : L3 : L3" | 36,000 |
| "EEE" | 1,200 |

| | | |
|---|---|---|
| 1 | "pass" | 1 |
| 2 | "pass" | 1 |
| 3 | "pass" | 1 |
| 10,200 | "pass" | 10,200 |
| 10,201 | "fail" | 10,200 |
| 10,202 | "pass" | 10,200 |
| . | . | . |
| . | . | . |
| . | . | . |

FIG. 5

| | | | | | | |
|---|---|---|---|---|---|---|
| 700 ↘ | 1 | "AAA : Subtest1" | 1 | 800 ↘ | 1 | "pass" |
| | 2 | "AAA : Subtest2" | 1 | | 2 | "pass" |
| | 3 | "AAA : Subtest3" | 1 | | 3 | "pass" |
| | 10,200 | "BBB : L1 : Subtest1" | 10,200 | | 10,200 | "pass" |
| | 10,201 | "BBB : L1 : Subtest2" | 10,200 | | 10,201 | "fail" |
| | 10,202 | "BBB : L1 : Subtest3" | 10,200 | | 10,202 | "pass" |
| | 10,220 | "CCC : L1 : Subtest1" | 10,220 | | 10,220 | "pass" |
| | 10,221 | "CCC : L1 : Subtest2" | 10,220 | | 10,221 | "pass" |
| | 10,222 | "CCC : L1 : Subtest3" | 10,220 | | 10,222 | "pass" |
| | 12,000 | "DDD : L1 : L1 : Subtest1" | 12,000 | | 12,000 | "pass" |
| | 12,005 | "DDD : L1 : L1 : Subtest2" | 12,000 | | 12,005 | "pass" |
| | 12,010 | "DDD : L1 : L1 : Subtest3" | 12,000 | | 12,010 | "pass" |
| | 14,000 | "DDD : L1 : L2 : Subtest1" | 14,000 | | 14,000 | "pass" |
| | 14,005 | "DDD : L1 : L2 : Subtest2" | 14,000 | | 14,005 | "pass" |
| | 14,010 | "DDD : L1 : L2 : Subtest3" | 14,000 | | 14,010 | "pass" |
| | 16,000 | "DDD : L1 : L3 : Subtest1" | 16,000 | | 16,000 | "pass" |
| | 16,005 | "DDD : L1 : L3 : Subtest2" | 16,000 | | 16,005 | "pass" |
| | 16,010 | "DDD : L1 : L3 : Subtest3" | 16,000 | | 16,010 | "pass" |
| | 20,200 | "BBB : L2 : Subtest1" | 20,200 | | 20,200 | "pass" |
| | 20,201 | "BBB : L2 : Subtest2" | 20,200 | | 20,201 | "pass" |
| | 20,202 | "BBB : L2 : Subtest3" | 20,200 | | 20,202 | "pass" |
| | 20,220 | "CCC : L2 : Subtest1" | 20,220 | | 20,220 | "pass" |
| | 20,221 | "CCC : L2 : Subtest2" | 20,220 | | 20,221 | "pass" |
| | 20,222 | "CCC : L2 : Subtest3" | 20,220 | | 20,222 | "pass" |
| | 22,000 | "DDD : L2 : L1 : Subtest1" | 22,000 | | 22,000 | "pass" |
| | 22,005 | "DDD : L2 : L1 : Subtest2" | 22,000 | | 22,005 | "pass" |
| | 22,010 | "DDD : L2 : L1 : Subtest3" | 22,000 | | 22,010 | "pass" |
| | 24,000 | "DDD : L2 : L2 : Subtest1" | 24,000 | | 24,000 | "pass" |
| | 24,005 | "DDD : L2 : L2 : Subtest2" | 24,000 | | 24,005 | "pass" |
| | 24,010 | "DDD : L2 : L2 : Subtest3" | 24,000 | | 24,010 | "pass" |
| | 26,000 | "DDD : L2 : L3 : Subtest1" | 26,000 | | 26,000 | "pass" |
| | 26,005 | "DDD : L2 : L3 : Subtest2" | 26,000 | | 26,005 | "pass" |
| | 26,010 | "DDD : L2 : L3 : Subtest3" | 26,000 | | 26,010 | "pass" |
| | 30,200 | "BBB : L3 : Subtest1" | 30,200 | | 30,200 | "fail" |
| | 30,201 | "BBB : L3 : Subtest2" | 30,200 | | 30,201 | "fail" |
| | 30,202 | "BBB : L3 : Subtest3" | 30,200 | | 30,202 | "fail" |
| | 30,220 | "CCC : L3 : Subtest1" | 30,220 | | 30,220 | "pass" |
| | 30,221 | "CCC : L3 : Subtest2" | 30,220 | | 30,221 | "pass" |
| | 30,222 | "CCC : L3 : Subtest3" | 30,220 | | 30,222 | "pass" |
| | 32,000 | "DDD : L3 : L1 : Subtest1" | 32,000 | | 32,000 | "pass" |
| | 32,005 | "DDD : L3 : L1 : Subtest2" | 32,000 | | 32,005 | "pass" |
| | 32,010 | "DDD : L3 : L1 : Subtest3" | 32,000 | | 32,010 | "pass" |
| | 34,000 | "DDD : L3 : L2 : Subtest1" | 34,000 | | 34,000 | "pass" |
| | 34,005 | "DDD : L3 : L2 : Subtest2" | 34,000 | | 34,005 | "pass" |
| | 34,010 | "DDD : L3 : L2 : Subtest3" | 34,000 | | 34,010 | "pass" |
| | 36,000 | "DDD : L3 : L3 : Subtest1" | 36,000 | | 36,000 | "pass" |
| | 36,005 | "DDD : L3 : L3 : Subtest2" | 36,000 | | 36,005 | "pass" |
| FIG. 7 | 36,010 | "DDD : L3 : L3 : Subtest3" | 36,000 | FIG. 8 | 36,010 | "pass" |
| | 1,200 | "EEE : Subtest1" | 1,200 | | 1,200 | "pass" |
| | 1,201 | "EEE : Subtest2" | 1,200 | | 1,201 | "pass" |
| | 1,202 | "EEE : Subtest3" | 1,200 | | 1,202 | "pass" |

METHODS AND APPARATUS FOR IDENTIFYING TEST NUMBER COLLISIONS

BACKGROUND OF THE INVENTION

Some forms of circuit test provide an engineer with large volumes of test results. To assist the engineer in managing and referring to these test results, each test result may be associated with a test number. Preferably, test numbers are not duplicated. However, when test numbers are assigned manually, or by rudimentary "automatic" means, it can be difficult to avoid or track down duplicate test numbers.

SUMMARY OF THE INVENTION

One aspect of the invention is embodied in a method for assigning test numbers. In accordance with the method, current testflow context information is maintained during the execution of a testflow. Upon generation of a new test number for a result of a subtest in the testflow, a database of test numbers is indexed using the new test number. If the new test number appears as an entry in the database, a unique identifier associated with the entry is compared to index information comprising 1) an identifier of the subtest, and 2) the current testflow context information. If the unique identifier does not match the index information, a test number collision is identified. Otherwise, the new test number is assigned to the subtest.

Another aspect of the invention is also embodied in a method for assigning test numbers. In accordance with the method, current testflow context information is maintained during the execution of a testflow. Upon execution of a subtest in the testflow, a database of test numbers is indexed using index information comprising 1) an identifier of the subtest, and 2) the current testflow context information. If a test number corresponding to the index information exists in the database, the test number is assigned to a result of the subtest. If a test number corresponding to the index information does not exist in the database, a new test number is generated as follows. If one or more test number factors have been specified for one or more levels of the current testflow context, the test number factors are used to determine a base number for a current test number range. Otherwise, the base number is set to a default base number. The new test number is then set to a next test number in the current test number range. After generating the new test number, the database of test numbers is indexed using the new test number. If the new test number appears as an entry in the database, the afore-mentioned index information is compared to a unique identifier that is associated with the entry. If the index information does not match the unique identifier, a test number collision is identified. Otherwise, the new test number is assigned to the subtest.

Yet another aspect of the invention is embodied in a test number engine. The test number engine comprises computer readable media, and program code that is stored on the computer readable media. The program code comprises code to generate a new test number for a result of a subtest in a testflow. The program code also comprises code to use the new test number as an index into a database of test numbers and, if the new test number appears as an entry in the database, compare a unique identifier associated with the entry to index information comprising 1) an identifier of the subtest, and 2) current testflow context information. The engine further comprises code to identify a test number collision if the unique identifier and index information do not match, else assign the new test number to the subtest.

Other embodiments of the invention are also disclosed.

BRIEF DESCRIPTION OF THE DRAWINGS

Illustrative and presently preferred embodiments of the invention are illustrated in the drawings, in which:

FIG. 3 illustrates a progression of testflow context information for the FIG. 2 testflow;

FIG. 4 illustrates an exemplary database of test number ranges;

FIG. 5 illustrates an exemplary portion of a test number database that may formed during execution of the FIG. 2 testflow;

FIG. 7 illustrates a database of test numbers that may be generated in response to execution of the FIG. 2 testflow;

FIG. 8 illustrates a database of test results that may be generated in response to execution of the FIG. 2 testflow;

DESCRIPTION OF THE PREFERRED EMBODIMENT

Figure 1:
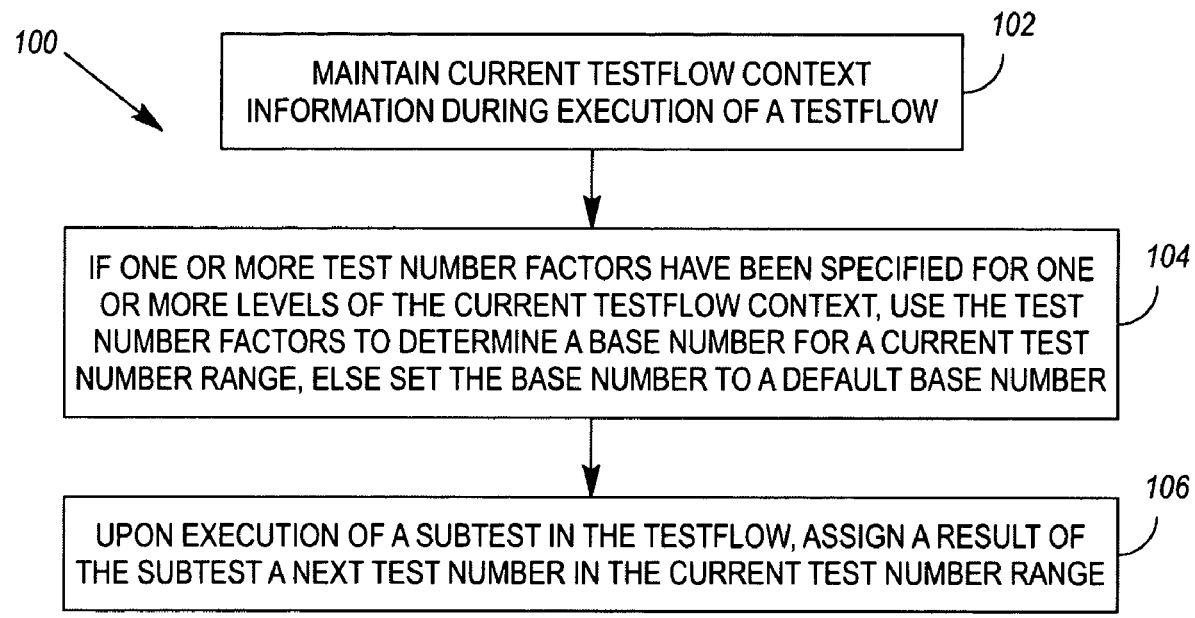
FIG. 1 illustrates an exemplary method for assigning test numbers.

Before describing various methods and apparatus for identifying test number collisions, some exemplary contexts in which the invention may be applied will be described. To this end, FIG. 1 illustrates a first exemplary method 100 for assigning test numbers. In accordance with the method 100, current testflow context information is maintained 102 during execution of a testflow.

As defined herein, a "testflow" is any portion of a test program that is used to specify the type, number or order of tests that may be executed during circuit test. Testflow context information may comprise any information that assists in defining what portion of a test program is being executed. By way of example, testflow context information may comprise information such as a test suite designator, a port designator, a vector label, a vector designator, or a pin designator. Testflow context information may also comprise a loop designator and/or loop iteration designator for each of a number of loop layers (e.g., nested loops) that have been entered during execution of a testflow. As used herein, the term "designator" encompasses a string, number or any other means that can be used to designate a test suite, loop or other testflow context.

If one or more test number factors have been specified for one or more levels of the current testflow context, the test number factors are used 104 by the method 100 to determine a base number (e.g., a beginning number or reference number) for a current test number range. Otherwise, the base number is set to a default base number.

In one embodiment of the method 100, the base number is compiled by aggregating (e.g., summing or multiplying) a plurality of test number factors that have been specified for various levels of the current testflow context. By way of example, the test number factors may comprise increments or addends that are specified at any or all of: a loop level, a test suite level, or a subtest level.

In another embodiment of the method 100, a user may only be allowed to specify a single base number per testflow context. In this embodiment, the base number for the current test number range is determined by merely setting the base number equal to the user-specified base number. In this method, there is no aggregation of test number factors. However, a user may still provide base numbers at various points in a testflow, thereby causing certain test numbers to be grouped, for example. Further, because the base numbers are set contextually, test numbers that are assigned for a later test suite do not need to continue from the test numbers assigned for an earlier test suite. Further, if a base number is specified for one test suite, it is not automatically preserved for use with the next test suite.

Upon execution of a subtest in the testflow, the result of the subtest is then assigned 106 a next test number in the current test number range. A "subtest", as defined herein, may be a test that produces multiple test results, but is preferably a test or portion of a test that produces only a single test result.

Figure 2:
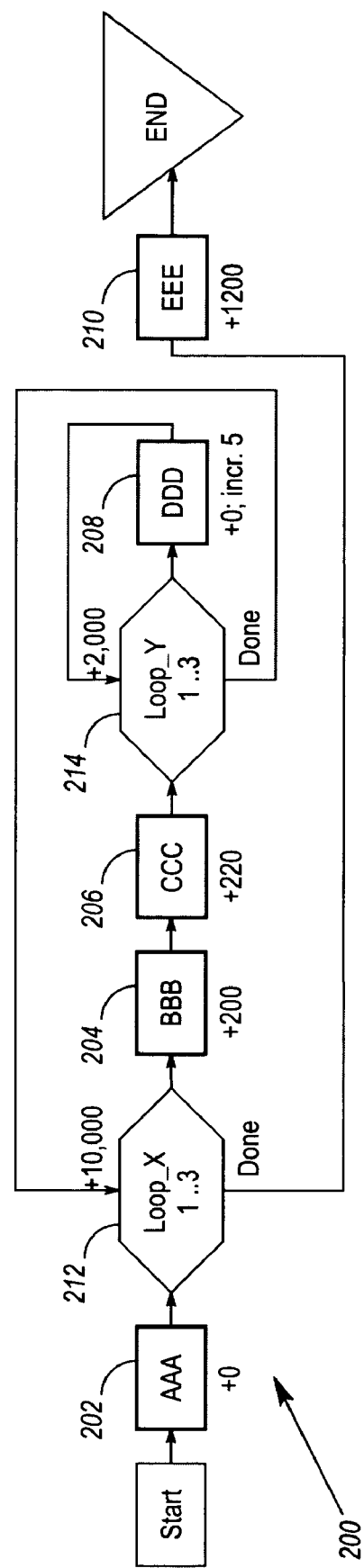
FIG. 2 illustrates an exemplary testflow.

FIG. 2 illustrates an exemplary testflow 200 for which testflow context information may be maintained. By way of example, the testflow 200 could be a system-on-a-chip testflow of the Agilent 93000 SOC Series tester (manufactured by Agilent Technologies, Inc. of Palo Alto, Calif., USA). The testflow 200 comprises five test suites 202, 204, 206, 208, 210, respectively named AAA, BBB, CCC, DDD and EEE. Each of the test suites 202–210 serves to contain and/or specify a number of subtests, and may include one or more test controls (e.g., test methods, test functions or user procedures). The testflow 200 also comprises two loops 212, 214, respectively named Loop_X and Loop_Y. By way of example, each loop 212, 214 specifies that its loop is to be iterated three times (i.e., 1 . . . 3).

FIG. 3 illustrates a progression of testflow context information 300 that may be maintained by the method 100 during execution of the testflow 200. Note that the initial testflow context 302 is merely "AAA", or the name of the first encountered test suite. After the test suite AAA has been executed, the testflow context then changes to "L1", which is indicative of the first iteration of Loop_X.

Upon entry into the test suite BBB, the testflow context then changes to "BBB: L1". Note that, for ease of reading, the testflow contexts shown in FIG. 3 adopt the convention of always placing the current test suite's name at the beginning of the context. However, this is certainly not required by the method 100, and need not be done.

Upon first entering Loop_Y, the testflow context changes to "L1:L1". The identities of Loop_X and Loop_Y are therefore inferred from the number and order of loop iterations maintained in the testflow context. However, the identities of the loops could also be called out with specificity, such as by noting the context as "X1:Y1".

Various contexts of the testflow 200 are associated with test number factors. That is, Loop_X is associated with the addend 10,000, test suite BBB is associated with the addend 200, test suite CCC is associated with the addend 220, Loop_Y is associated with the addend 2000, and test suite DDD is associated with the increment 5. Adjacent each testflow context, FIG. 3 illustrates the aggregate base number for the context. Thus, the base number for test suite BBB is 10,200 (10,000+200); the base number for test suite CCC during a first iteration of Loop_X is 10,220 (10,000+220); the base number for test suite DDD during a first iteration of Loop_X and first iteration of Loop_Y is 12,000 (10,000+2,000); and the base number for test suite EEE is 1200. However, the base number for test suite AAA is 1, which is the default base number.

If a test number factor is provided at a loop level (e.g., the addend 10,000 associated with Loop_X), the loop's test number factor may be factored into a base number repeated times. For example, consider the execution of test suite DDD during the second iteration of Loop_X and third iteration of Loop_Y. The base number for this context can be calculated as (10,000*2)+(2,000*3), or 26,000.

Assume now that each of the test suites 202–210 shown in FIG. 2 comprises three subtests, identified as Subtest1, Subtest2, and Subtest3. Note that although subtests of the same name may appear in each of the test suites 202–210, they need not be (and likely will not be) the same subtest. During execution of the testflow 200, the test numbers assigned to test suite AAA would be 1, 2 and 3. The test numbers assigned to test suite BBB during a first iteration of Loop_X would be 10,200, 10,201 and 10,202. Similarly, the test numbers assigned to test suite CCC during a first iteration of Loop_X would be 10,220, 10,221 and 10,222. The test numbers assigned to test suite DDD during first iterations of Loop_X and Loop_Y would be 12,000, 12,005 and 12,010 (i.e., numbers incremented by 5). Finally, the test numbers assigned to test suite EEE would include the integers 1200, 1201 and 1202.

Note that, for some testflows, different contexts of the testflow might intentionally (or unintentionally) share the same test number range. However, test numbers assigned to the two test suites will not collide, because each subtest draws a "next number" from the range, regardless of whether other test suites have already drawn numbers from the range.

Also note that two or more test suites may not only have the same base number, but may be associated with test number ranges that overlap or are interleaved. For example, if two test suites were respectively associated with base numbers of 1200 and 1201, and an increment of five, one test suite might be associated with the test numbers 1200, 1205 and 1210, while the other test suite might be associated with the test numbers 1201, 1206 and 1211. An overlap of test numbers might similarly result from test suites that are respectively associated with the base numbers 1200 and 1301, and an increment of two.

If the base number that is compiled for the current test number range is new, the base number may be used to initialize a new test number range in a database 400 of test number ranges. Then, for each test number range in the database 400, the test numbers that have been assigned from the test number range may be tracked. One way to do this is to store each range 402 along with the maximum test number 404 that has been assigned from the range. Then, each time a new test number is assigned from a range, its previous maximum test number may be incremented. Depending on the test factors that a user has assigned to a testflow, the increment may be a default increment, or an increment that a user has specified for a particular level or levels of the testflow (e.g., an increment that is associated with a level of a current testflow context).

As test numbers are assigned to results, a test number database may be compiled by storing each test number along with the base number from which it was derived. Optionally, the test number database may be integrated with a results database, such that a result, its test number, and the base number from which the test number was derived, are all stored in the same database. A portion of such a database 500 is shown in FIG. 5. Alternately, the test number database may be integrated with testflow context information, such that a test number, its testflow context information, and the base number from which the test number was derived, are all stored in the same database. This latter form of database is illustrated in FIG. 7.

After storing the database 500 or 700, but prior to a subsequent testflow execution, the database 500 or 700 may be read to identify the various base numbers stored therein. For each identified base number, a test number range may be initialized, and the database 500 or 700 may be parsed to determine the extent of test numbers that have already been derived from the test number range. Then, during a subsequent testflow execution, the initialized test number ranges may be used to assign any new test numbers corresponding to the initialized test number ranges.

Figure 6:
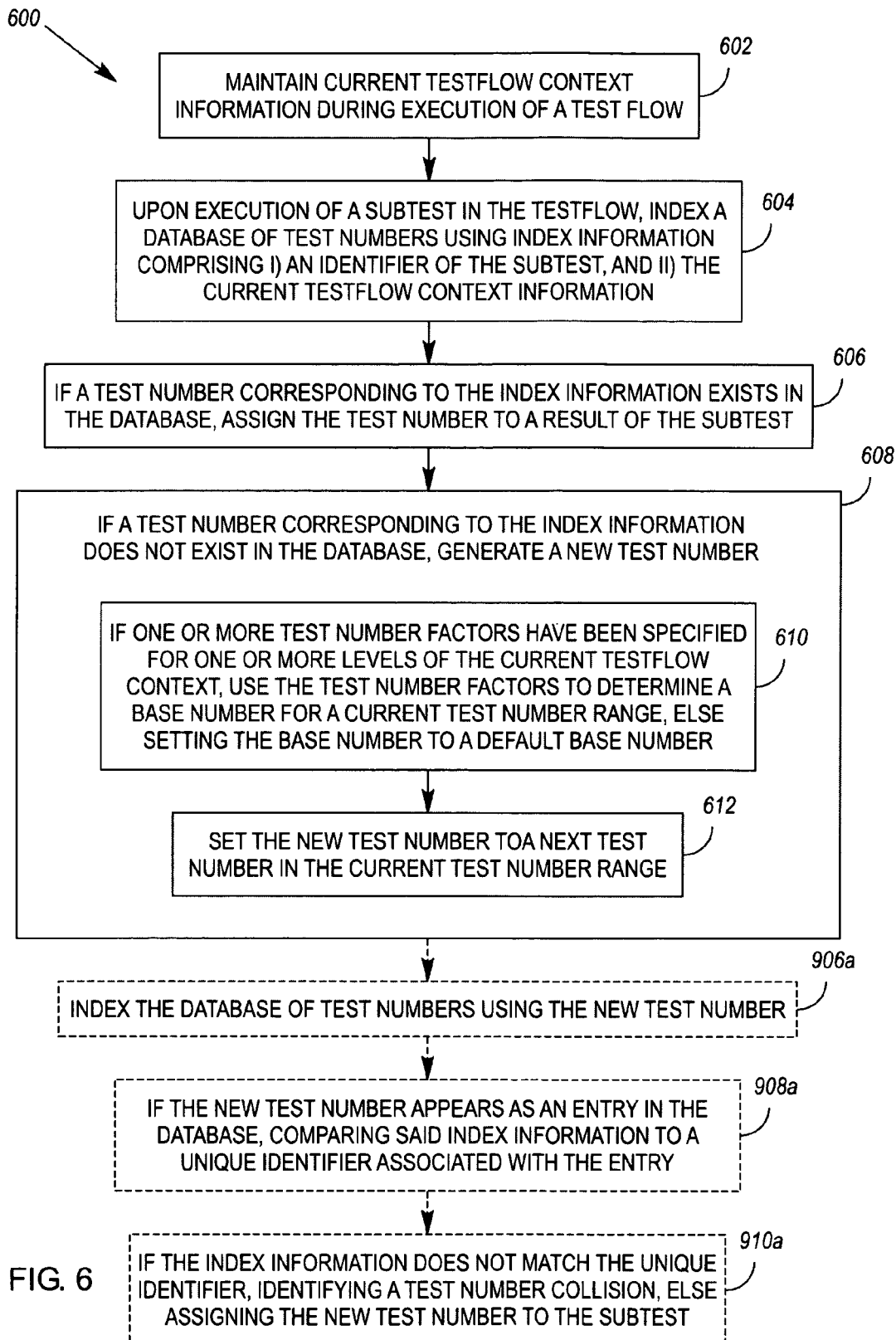
FIG. 6 illustrates a second exemplary method for assigning test numbers.

In one embodiment, the method 100 may be combined with the method for assigning test numbers disclosed in the U.S. patent application Ser. No. 10/839,887 of Robert S. Kolman, et al. entitled "Method and Apparatus for Assigning Test Numbers" filed the same day as this application). In accordance with this combination, FIG. 6 illustrates a second exemplary method 600 for assigning test numbers. In method 600, current testflow context information is maintained 602 during the execution of a testflow. Upon execution of a subtest in the testflow, a database of test numbers is indexed 604 using index information comprising 1) an identifier of the subtest, and 2) the current testflow context information. If a test number corresponding to the index information exists in the database, the test number is assigned 606 to a result of the subtest. If a test number corresponding to the index information does not exist in the database, a new test number is generated 608. The new test number is generated as follows. If one or more test number factors have been specified for one or more levels of the current testflow context, the test number factors are used 610 to determine a base number for a current test number range. Otherwise, the base number is set to a default base number. The new test number is then set 612 to a next test number in the current test number range.

Turning again to the exemplary testflow 200, upon execution of the first subtest in the testflow 200, index information comprising an identifier of the subtest (Subtest1) and the current testflow context information (AAA) is used to index a database of test numbers. If this is the first execution of the testflow 200, the database will be empty, and a new test number (e.g., 1) will be assigned to the result of Subtest1. The new test number (1) and index information (AAA: Subtest1) will also be associated in the database. During the first execution of the testflow 200, these steps continue, with the use of each successive index resulting in a database "miss", thereby causing a new test number, its associated index information (and possibly the base number from which it was derived) to be added to the database. Thus, after a first execution of the testflow 200, the database of test numbers 700 shown in FIG. 7 may have been created. At the same time, each newly created test number will be assigned to a test result of its corresponding subtest, thereby resulting in the database of test results 800 shown in FIG. 8. Although the test results shown in FIG. 8 are all presented in terms of "pass" or "fail", the test results of an actual test run could also or alternately comprise voltage readings, current readings, impedance measurements, and other sorts of test results.

Preferably, each of the subtests within a test suite is provided a unique subtest name, and enough testflow context information is maintained to ensure that each index into the database of test numbers 700 forms a unique subtest identifier. It is also preferred that each new test number entered into the database 700 is unique from all other test numbers in the database.

Figure 9:
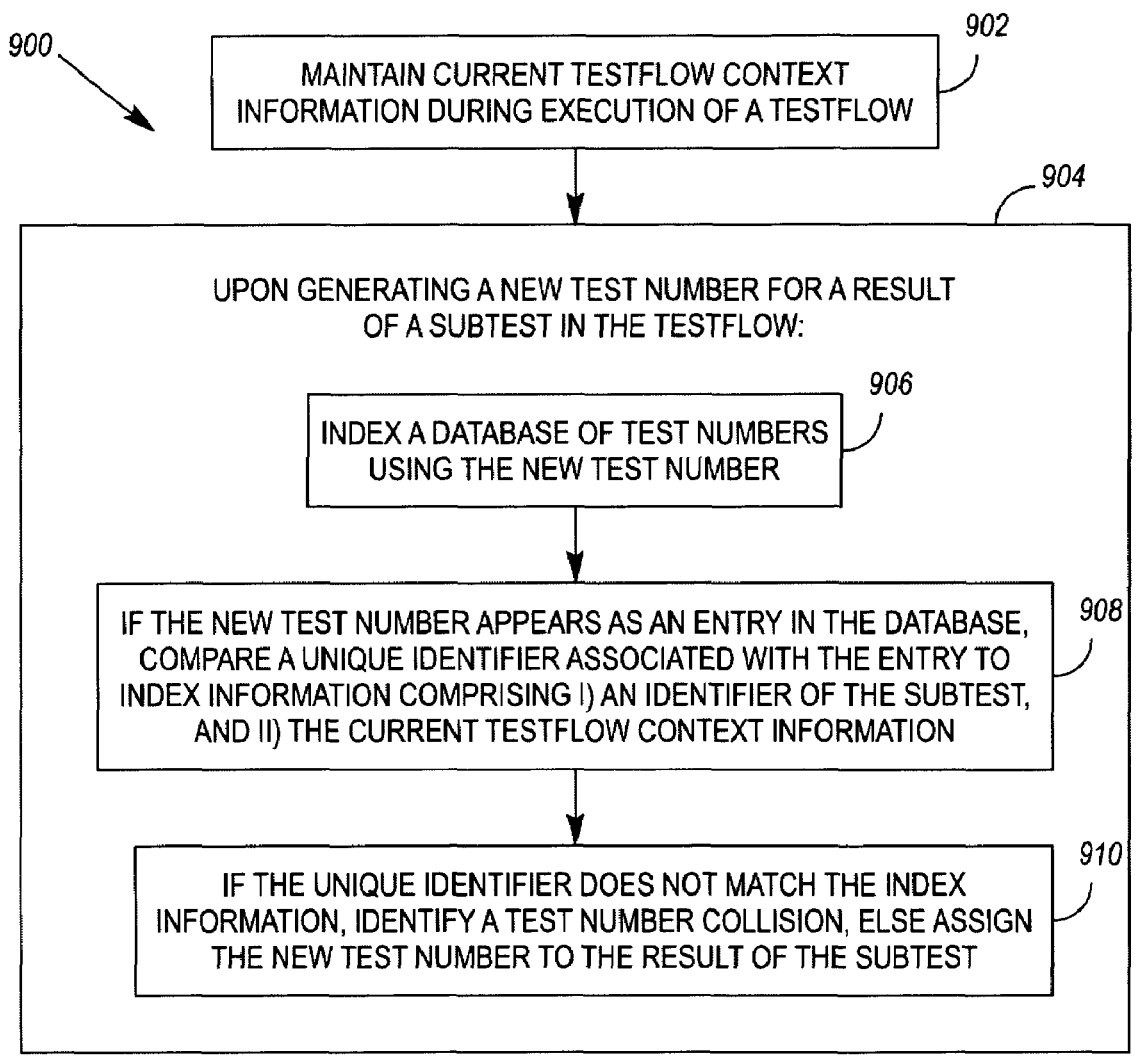
FIG. 9 illustrates a third exemplary method for assigning test numbers.

In the above-described methods 100, 600, as well as other methods for assigning test numbers, there exists the possibility that two test numbers will "collide". That is, it is possible that the methods 100, 600 could attempt to assign the same test number to two or more different subtests. Doing so could cause ambiguity, and possibly even corruption, in a test number database. FIG. 9 therefore illustrates a method 900 for assigning test numbers that enables collisions to be identified.

In accordance with the method 900, current testflow context information is maintained 902 during the execution of a testflow. Upon generation 904 of a new test number for a result of a subtest in the testflow, a database of test numbers (e.g., database 700) is indexed 906 using the new test number. If the new test number appears as an entry in the database, a unique identifier associated with the entry is compared 908 to index information comprising 1) an identifier of the subtest, and 2) the current testflow context information. If the unique identifier does not match the index information, a test number collision is identified 910. Otherwise, the new test number is assigned to the subtest. If the new test number is assigned to the subtest, the new test number and index information may then be associated in the database, with the index information serving as the new test number's unique identifier.

In response to identifying a test number collision, the method 900 could take a variety of actions. For example, the method 900 could merely program a graphical user interface to display a notification of the test number collision. The method 900 could also prompt a user to provide a replacement for one of the test numbers. Alternately (or additionally), the method 900 could log details of the test number collision into a collision log. The collision log could then be output to or viewed by a user.

In one embodiment, the method 900 responds to a test number collision by automatically generating another new test number, and then repeating the indexing 906, comparing 908 and identifying 910 actions using the additional new test number.

The boxes 906*a*, 908*a* and 910*a* of FIG. 6 illustrate how method 900 may be adapted to function as part of the method 600.

Figure 10:
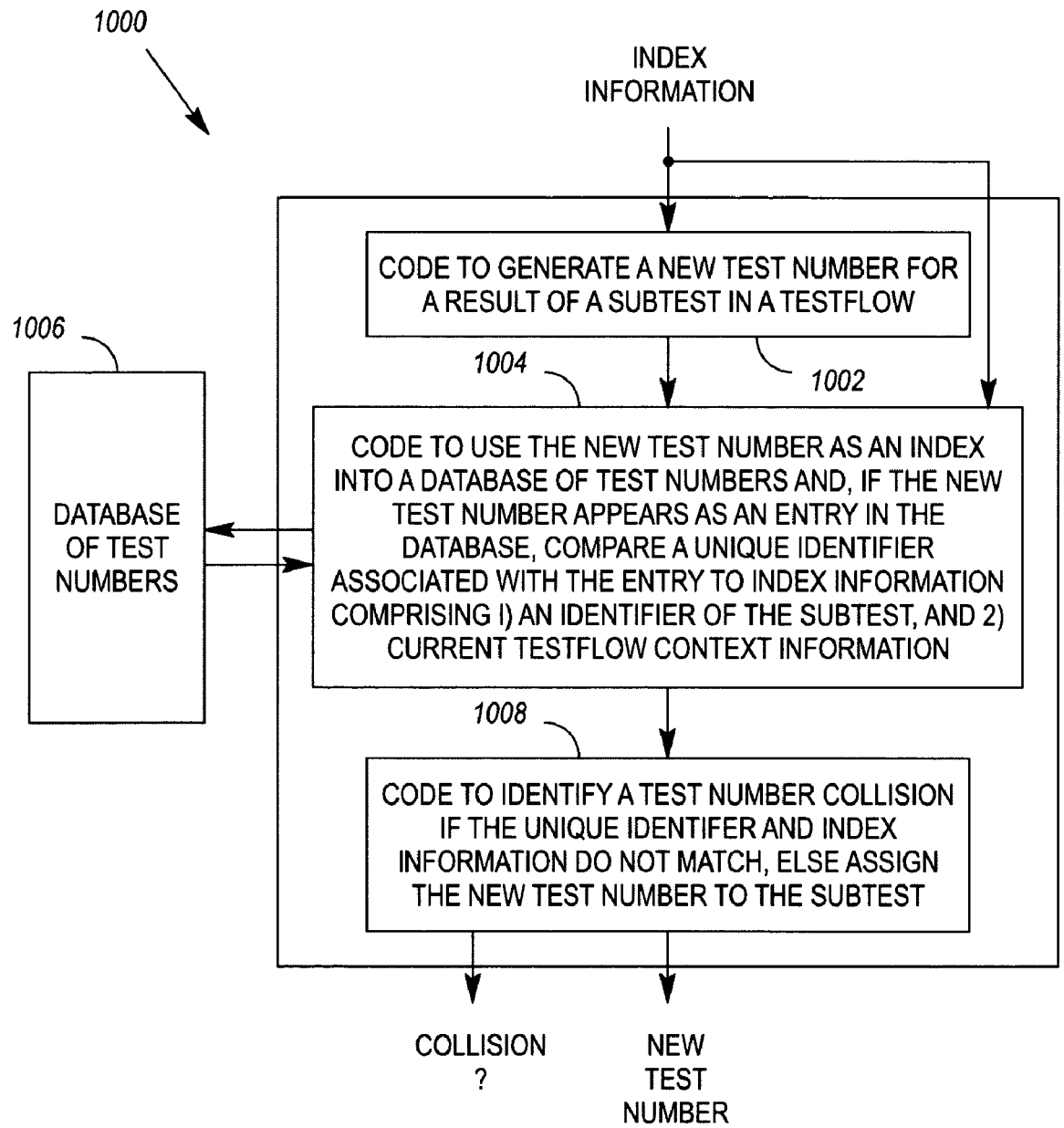
FIG. 10 illustrates an exemplary test number engine.

Any of the above methods may be implemented using program code. By way of example, FIG. 10 illustrates a test number engine 1000 that can be used to implement the method 100. The test number engine 1000 is embodied in program code stored on computer readable media (e.g., a magnetic or optical disk, a fixed or removable disk, or random access or read-only memory (RAM or ROM)). In some embodiments, the program code of the test number engine 1000 may be distributed among various computer readable media associated with one or a plurality of computer systems.

As shown, the test number engine 1000 comprises code 1002 to generate a new test number for a result of a subtest in a testflow. The engine 1000 also comprises code 1004 to use the new test number as an index into a database of test numbers 1006 and, if the new test number appears as an entry in the database 1006, compare a unique identifier associated with the entry to index information comprising 1) an identifier of the subtest, and 2) current testflow context information. The engine further comprises code 1008 to identify a test number collision if the unique identifier and index information do not match, else assign the new test number to the subtest.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for assigning test numbers, comprising:
   during execution of a testflow, maintaining current testflow context information;
   upon generation of a new test number for a result of a subtest in the testflow,
   indexing a database of test numbers using the new test number;
   if the new test number appears as an entry in the database, comparing a unique identifier associated with the entry to index information comprising i) an identifier of the subtest, and ii) the current testflow context information; and
   if the unique identifier does not match the index information, identifying a test number collision, else assigning the new test number to the subtest.

2. The method of claim 1, further comprising, in response to identifying a test number collision, programming a graphical user interface to display a notification of the test number collision.

3. The method of claim 1, further comprising, in response to identifying a test number collision, prompting a user to provide a replacement for one of the test numbers involved in the collision.

4. The method of claim 1, further comprising, in response to identifying a test number collision, logging details of the test number collision into a collision log.

5. The method of claim 1, further comprising, in response to identifying a test number collision:
   generating an additional new test number; and
   repeating said indexing, comparing and identifying using said additional new test number.

6. The method of claim 1, further comprising, if the new test number is assigned to the subtest, associating the new test number and index information in the database, said index information serving as the new test number's unique identifier.

7. The method of claim 1, wherein said testflow context information comprises a test suite designator.

8. The method of claim 1, wherein said testflow context information comprises a loop iteration designator.

9. The method of claim 1, wherein said testflow context information comprises a loop iteration designator for each of a number of loop layers.

10. The method of claim 1, wherein said testflow context information comprises at least one of: a port designator, a vector label, a vector designator, and a pin designator.

11. A method for assigning test numbers, comprising:
    during execution of a testflow, maintaining current testflow context information; and
    upon execution of a subtest in the testflow, indexing a database of test numbers using index information comprising i) an identifier of the subtest, and ii) the current testflow context information; and,
    if a test number corresponding to the index information exists in the database, assigning the test number to a result of the subtest; and
    if a test number corresponding to the index information does not exist in the database,
    generating a new test number by,
       if one or more test number factors have been specified for one or more levels of the current testflow context, using the test number factors to determine a base number for a current test number range, else setting the base number to a default base number; and
       setting the new test number to a next test number in the current test number range;
    indexing the database of test numbers using the new test number;
    if the new test number appears as an entry in the database, comparing said index information to a unique identifier associated with the entry; and
    if the index information does not match the unique identifier, identifying a test number collision, else assigning the new test number to the subtest.

12. The method of claim 11, further comprising, in response to identifying a test number collision, programming a graphical user interface to display a notification of the test number collision.

13. The method of claim 11, further comprising, in response to identifying a test number collision, prompting a user to provide a replacement for one of the test numbers involved in the collision.

14. The method of claim 11, further comprising, in response to identifying a test number collision, logging details of the test number collision into a collision log.

15. The method of claim 11, further comprising, in response to identifying a test number collision:
    generating an additional new test number; and
    repeating said indexing, comparing and identifying using said additional new test number.

16. The method of claim 11, further comprising, if the new test number is assigned to the subtest, associating the new test number and index information in the database, said information serving as the new test number's unique identifier.

17. A test number engine, comprising:
    computer readable media; and
    program code, stored on said computer readable media, comprising:
       code to generate a new test number for a result of a subtest in a testflow;
       code to use the new test number as an index into a database of test numbers and, if the new test number appears as an entry in the database, compare a unique identifier associated with the entry to index information comprising i) an identifier of the subtest, and ii) current testflow context information; and
       code to identify a test number collision if the unique identifier and index information do not match, else assign the new test number to the subtest.

* * * * *

UNITED STATES PATENT AND TRADEMARK OFFICE
CERTIFICATE OF CORRECTION

PATENT NO. : 7,031,867 B2 Page 1 of 1
APPLICATION NO. : 10/839834
DATED : April 18, 2006
INVENTOR(S) : Kolman et al.

It is certified that error appears in the above-identified patent and that said Letters Patent is hereby corrected as shown below:

On the face page, in field (56), under "Other Publications", in column 2, line 4, delete "1-9)." and insert -- 1-9), Attorney Docket No. 10040433-1. --, therefor.

On the face page, in field (56), under "Other Publications", in column 2, line 8, delete "1-10)." and insert -- 1-10), Attorney Docket No. 10040434-1. --, therefor.

On the face page, in field (56), under "Other Publications", in column 2, line 10, delete "Text" and insert -- Test --, therefor.

On the face page, in field (56), under "Other Publications", in column 2, line 12, delete "1-13)." and insert -- 1-13), Attorney Docket No. 10040435-1. --, therefor.

Signed and Sealed this

Twelfth Day of December, 2006

JON W. DUDAS
*Director of the United States Patent and Trademark Office*